(12) United States Patent
Seki

(10) Patent No.: US 7,193,360 B2
(45) Date of Patent: Mar. 20, 2007

(54) SELF LIGHT EMITTING DISPLAY DEVICE AND INFORMATION EQUIPMENT EMPLOYING THE SAME

(75) Inventor: Shuichi Seki, Yonezawa (JP)

(73) Assignee: Tohoku Pioneer Corporation, Yamagata (JP)

(*) Notice: Subject to any disclaimer, the term of this patent is extended or adjusted under 35 U.S.C. 154(b) by 29 days.

(21) Appl. No.: 10/828,321

(22) Filed: Apr. 21, 2004

(65) Prior Publication Data

US 2004/0239258 A1 Dec. 2, 2004

(30) Foreign Application Priority Data

May 27, 2003 (JP) .............................. 2003-148517

(51) Int. Cl.
*H01J 1/62* (2006.01)
*H01L 29/04* (2006.01)

(52) U.S. Cl. .................. 313/504; 313/506; 315/169.3; 257/72

(58) Field of Classification Search ............. 315/169.3; 313/506; 257/72
See application file for complete search history.

(56) References Cited

U.S. PATENT DOCUMENTS

| 5,652,067 A | * | 7/1997 | Ito et al. ................... 428/690 |
|---|---|---|---|
| 5,847,506 A | * | 12/1998 | Nakayama et al. ......... 313/504 |
| 6,258,618 B1 | * | 7/2001 | Lester .......................... 438/46 |
| 6,280,860 B1 | * | 8/2001 | Ueda et al. ................. 428/690 |
| 6,410,168 B1 | * | 6/2002 | Tamura ...................... 428/690 |
| 6,858,271 B1 | * | 2/2005 | Okada et al. ................ 428/1.4 |
| 2004/0004594 A1 | * | 1/2004 | Kato et al. .................... 345/87 |
| 2004/0012531 A1 | * | 1/2004 | Toda .......................... 343/702 |
| 2004/0206960 A1 | * | 10/2004 | Nishikawa ................... 257/72 |

FOREIGN PATENT DOCUMENTS

| JP | 2000-58260 | | 2/2000 |
|---|---|---|---|
| JP | 2000-058260 | * | 2/2000 |

* cited by examiner

*Primary Examiner*—Trinh Vo Dinh
(74) *Attorney, Agent, or Firm*—Westerman, Hattori, Daniels & Adrian, LLP.

(57) ABSTRACT

In a self light emitting display device of the present invention, a first electrode 3 for example formed of a thin film of ITO is formed in a striped pattern on a glass substrate 2, and a film of a light emission functional layer 6 is formed thereon. A metallic second electrode 7 is formed on the light emission functional layer 6, and a light transmitting sealing member 8 for example formed of a glass material is superimposed on the second electrode 7. Apertures 7a for allowing image light from the light emission functional layer 6 to pass through are formed on a part of the second electrode 7, a first light emitting area L1 is formed in the glass substrate 2 side, and a second light emitting area L2 is formed in the sealing member 8 side. As a result, display images can be visually recognized on both front and rear surfaces.

20 Claims, 6 Drawing Sheets

FIG.3A

| d 11 | d 21 | d 31 | d 41 | · · | · · | d m1 | ← R 1 |
| --- | --- | --- | --- | --- | --- | --- | --- |
| d 12 | d 22 | d 32 | d 42 | · · | · · | d m2 | ← R 2 |
| d 13 | d 23 | d 33 | d 43 | · · | · · | d m3 | ← R 3 |
| d 14 | d 24 | d 34 | d 44 | · · | · · | d m4 | ← R 4 |
| · · | · · | · · | · · | · · | · · | · · | ← R · |
| · · | · · | · · | · · | · · | · · | · · | ← R · |
| d 1n | d 2n | d 3n | d 4n | · · | · · | d mn | ← R n |

FIG.3B

| | d 11 | d 21 | d 31 | d 41 | · · | · · | d m1 |
| --- | --- | --- | --- | --- | --- | --- | --- |
| R n → | | | | | | | |
| R · → | d 12 | d 22 | d 32 | d 42 | · · | · · | d m2 |
| R · → | d 13 | d 23 | d 33 | d 43 | · · | · · | d m3 |
| R 4 → | d 14 | d 24 | d 34 | d 44 | · · | · · | d m4 |
| R 3 → | · · | · · | · · | · · | · · | · · | · · |
| R 2 → | · · | · · | · · | · · | · · | · · | · · |
| R 1 → | d 1n | d 2n | d 3n | d 4n | · · | · · | d mn |

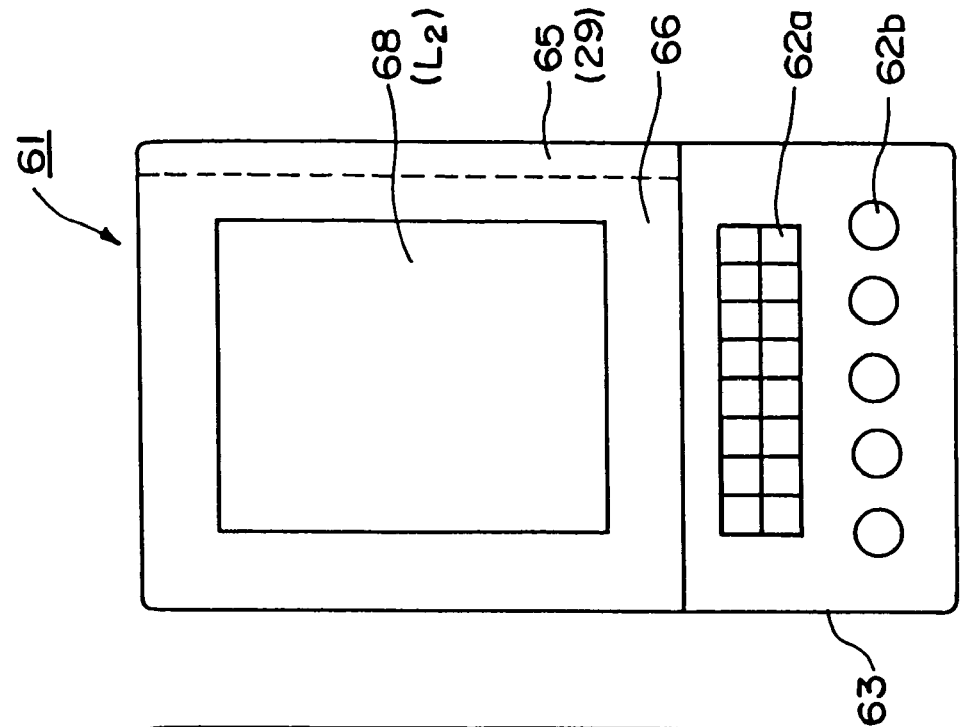
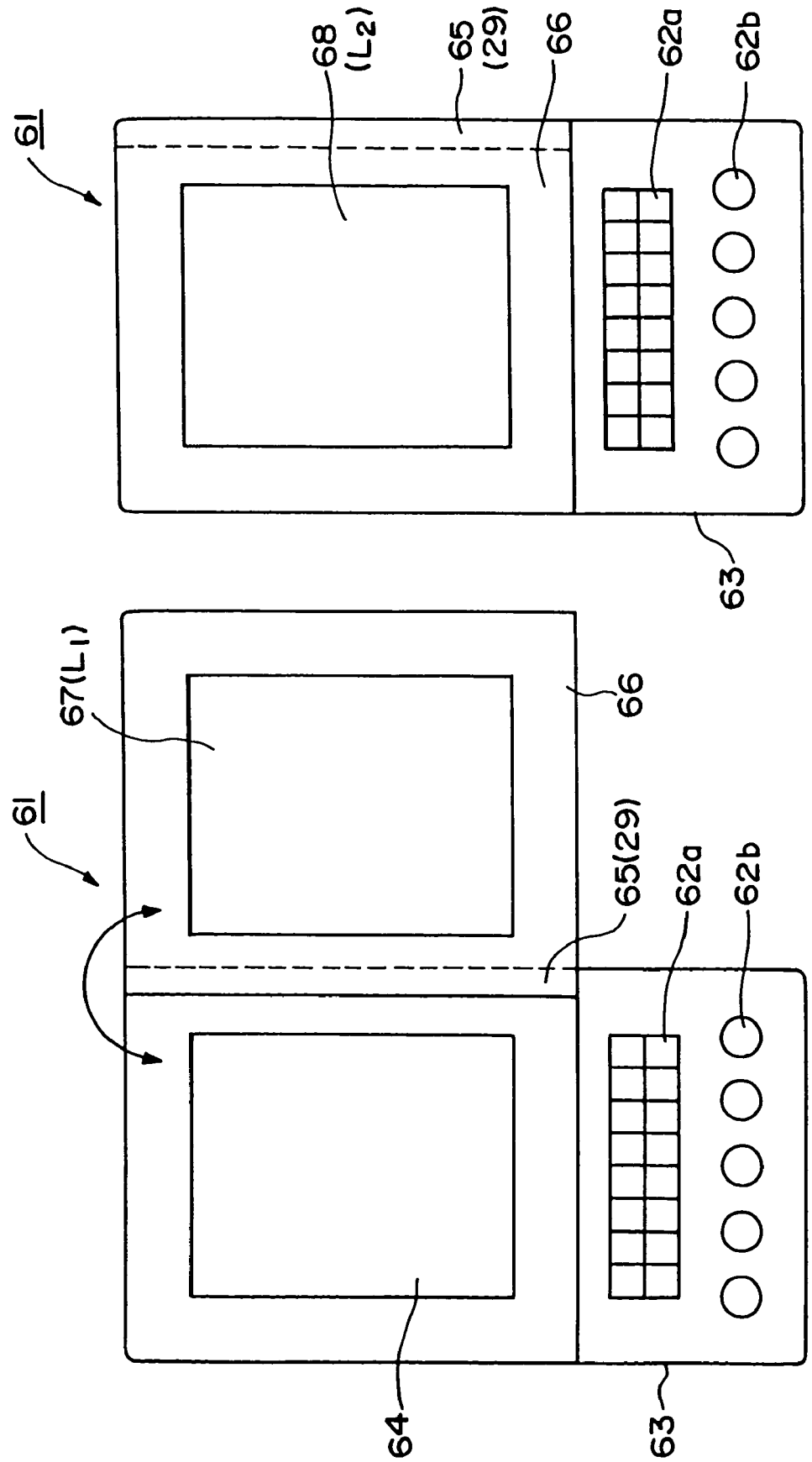

SELF LIGHT EMITTING DISPLAY DEVICE AND INFORMATION EQUIPMENT EMPLOYING THE SAME

BACKGROUND OF THE INVENTION

Field of the Invention

The present invention relates to a self light emitting display device in which for example organic EL (electroluminescent) display elements are employed as light emitting pixels, and particularly to a self light emitting display device which is constructed in such a way that display images can be visually recognized on both front and rear faces of a display device and to information equipment employing this self light emitting display device.

Description of the Related Art

A display employing a display panel which is constructed by arranging light emitting elements in a matrix pattern has been developed widely. As the light emitting element employed in such display panel, an organic EL element in which an organic material is employed in a light emitting layer has attracted attention, and a display of a self-emitting type in which the organic EL elements are arranged in a matrix pattern has been commercialized partly. This is because of a background that by employing, in a light emission functional layer constituting an EL element, an organic compound which enables an excellent light emission characteristic to be expected, progress in a high efficiency and a long life by which an EL element can be fit for practical use has been made.

As a display panel employing the above-mentioned organic EL elements, a passive matrix type display panel in which EL elements are simply arranged in a matrix pattern and an active matrix type display panel in which respective active elements for example constituted by TFTs (thin film transistors) are added to respective EL elements arranged in a matrix pattern have been proposed. However, in either type, in order to drive and control respective light emitting elements (pixels), the light emission functional layer is sandwiched between a first electrode and a second electrode.

One electrode is formed for example by an ITO (indium tin oxide) film that is a light transmitting electrically conductive material so that light from the light emission functional layer is drawn to the outside via the electrode made of ITO. That is, this conventional type of self emitting display is constructed in such a way that images are reproduced on one surface side of the display.

Meanwhile, a board utilizing the EL light emitting board has been proposed for a guide display board which is arranged in a public facility such as a railroad station, and a double-sided self emitting type display device which can display different guide information for respective front and rear faces of the guide display board is disclosed in Japanese Patent Application Laid-Open No. 2000-58260 (paragraph 0020, FIG. 1).

The double-sided self emitting type display device disclosed in the Japanese Patent Application Laid-Open No. 2000-58260 has a form in which one-sided display type light emitting display panels conventionally known are stacked back to back so to speak, and in this case, a rear surface electrode for example constituted by a metal is shared for common use to make the display device thinner though not quite satisfactorily.

In a guide display board or the like arranged in a public facility or the like as described above, it is considered that since displaying guide information on both faces thereof is the main purpose and since the extent of requirement of making the display thinner is not so high, the rear surface electrode is shared to make the display thinner in accordance with the requirement. However, in portable type information equipment whose demand has become greater remarkably these days, for example, in a foldable cellular telephone, a display portion constituted by a relatively large-sized LCD which is used in an opened state as is commonly known and a display portion constituted by a small-sized LCD which is used in a closed state are arranged in a back-to-back state.

In a display device displaying information on both front and rear faces used in such foldable cellular telephone, further making it thinner is desired, and it has been a significant technical problem to further make it lighter in addition to making it thinner.

SUMMARY OF THE INVENTION

The present invention has been developed from the above-described technical view point, and it is an object of the present invention to provide a self light emitting type display device which can be expected to be made thinner and lighter and by which double-sided display is possible and to provide information equipment employing such display device.

A self light emitting display device according to the present invention which has been developed to carry out the object is a self light emitting display device with a structure wherein a first electrode is formed on a transparent substrate, light emitting pixels by a light emission functional layer which is composed of at least one or more layers are formed on the first electrode, a second electrode is formed on the light emission functional layer, and the second electrode is covered with a sealing member, characterized in that the first electrode is constructed so as to allow light from the light emitting pixels to pass through the transparent substrate side, that the second electrode is constructed so as to allow light from the light emitting pixels to pass through the sealing member side, and that at least a part of the sealing member is formed of a light transmitting material.

Information equipment according to the present invention which has been developed to carry out the object is information equipment in which a self light emitting display device is loaded as a display, characterized by being constructed in such a way that a display image by light emitting pixels can be visually recognized from both front and rear surfaces of the display.

BRIEF DESCRIPTION OF THE DRAWINGS

FIG. 3 is schematic views showing processing examples of mirror inversion operations for images performed in the lighting drive circuit shown in FIG. 2;

FIG. 6 is similarly views showing a third embodiment of information equipment.

DESCRIPTION OF THE PREFERRED EMBODIMENTS

An embodiment regarding a self light emitting display device according to the present invention will be first described below, and embodiments regarding information equipment employing such display device will be described later. Although the self light emitting display device described below will be described based on an active matrix type organic EL display device employing an organic compound in a light emission functional layer, the present invention does not adhere to such form and can be applied to a passive matrix type display device as described later.

Figure 1:
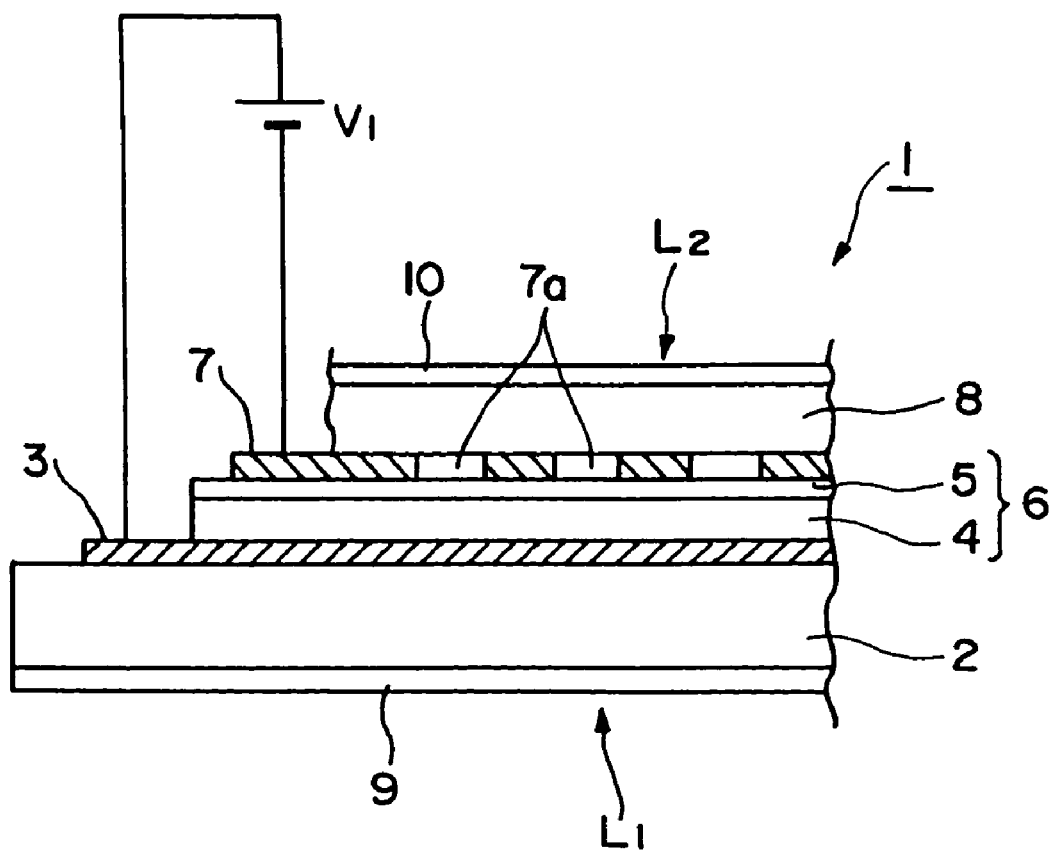
FIG. 1 is a cross-sectional view showing a lamination structure of a self light emitting display device according to the present invention.

First, FIG. 1 is a cross-sectional view schematically showing a lamination state of an organic EL display panel 1 as a self light emitting display device according to the present invention. Reference numeral 2 denotes a glass substrate as a transparent substrate, and a plurality of first electrodes 3 are formed on the glass substrate 2 in a striped pattern. A thin film of well-known ITO or the like is employed for the first electrodes 3 and is patterned on the glass substrate 2 by using a general photolithographic method. Thus, light from light emitting pixels formed in the light emission functional layer described later can be allowed to pass through the first electrodes 3 made of a thin film of ITO or the like and to be discharged into the glass substrate 2 side.

A hole transport layer 4 is formed over the glass substrate 2 for example by deposition, and a film of a light emitting layer 5 made of an organic compound is formed on the hole transport layer 4 similarly by deposition, so that a light emission functional layer 6 is formed by these layers. In the light emission functional layer 6, although in reality films of an electron transport layer, an electron injection layer, and the like are formed on the light emitting layer 5, these films are omitted for convenience of illustration. A second electrode 7 is formed on the light emission functional layer 6. A metal which for example mainly composed of aluminum can be employed for the second electrode 7, and this second electrode 7 can be constituted by one layer of mat electrode (common electrode) in an active matrix type display panel.

In this way, in the case where the second electrode 7 is constituted by one layer of mat electrode, it is desired to form at least one aperture 7a which allow light to pass through, corresponding to parts of the second electrode 7, preferably to respective pixels. Thus, lights from light emitting pixels formed in the light emission functional layer 6 can be discharged into a later-described sealing member side which corresponds to the rear face thereof, respectively. Further, a sealing member 8 made of a light transmitting material, for example, a glass material, is superimposed on the second electrode 7 to form the display panel 1.

Here, drive TFTs each of which is arranged for each pixel as described later are turned on to allow anode and cathode of a direct current source V1 to be connected to the first electrode 3 and the second electrode 7, respectively, as equivalently shown in FIG. 1. Thus, holes from the first electrode 3 and electrons from the second electrode 7 are recombined at respective pixel portions in the light emitting layer 5 to emit light. The light by this light emission function is brought out to the outside via the first electrode 3 made of ITO and the glass substrate 2 as described above. Also, the light by the light emission function is brought out to the outside via the apertures 7a formed on a part of the second electrode 7 and the sealing member 8 made of the glass material.

A light emitting area formed in the glass substrate 2 side by the light emitting pixels formed in the light emission functional layer 6 may be called a first light emitting area L1, and a light emitting area formed in the sealing member 8 side may be called a second light emitting area L2. With the structure in which respective light emitting areas are formed on the front and the rear in this way, since outside light penetrates for example from the first light emitting area L1 side toward the second light emitting area L2 side (or vise versa), even if pixels emit light, it is impossible to produce high contrast.

Thus, in the embodiment shown in FIG. 1, a first polarizing plate 9 and a second polarizing plate 10 are affixed on a surface of the glass substrate 2 and a surface of the sealing member 8, respectively, so that the polarizing surfaces of the first polarizing plate and the second polarizing plate are in the relationship in which they are mutually perpendicular. Therefore, by the combination of these two polarizing plates, penetration of outside light is prevented, and in the case where the respective light emitting areas are seen from both front and rear faces, the light emitting areas have a display form by which they become a black face. The structure described above can provide a double-sided self light emitting type display panel which can be made further thinner and lighter.

Figure 2:
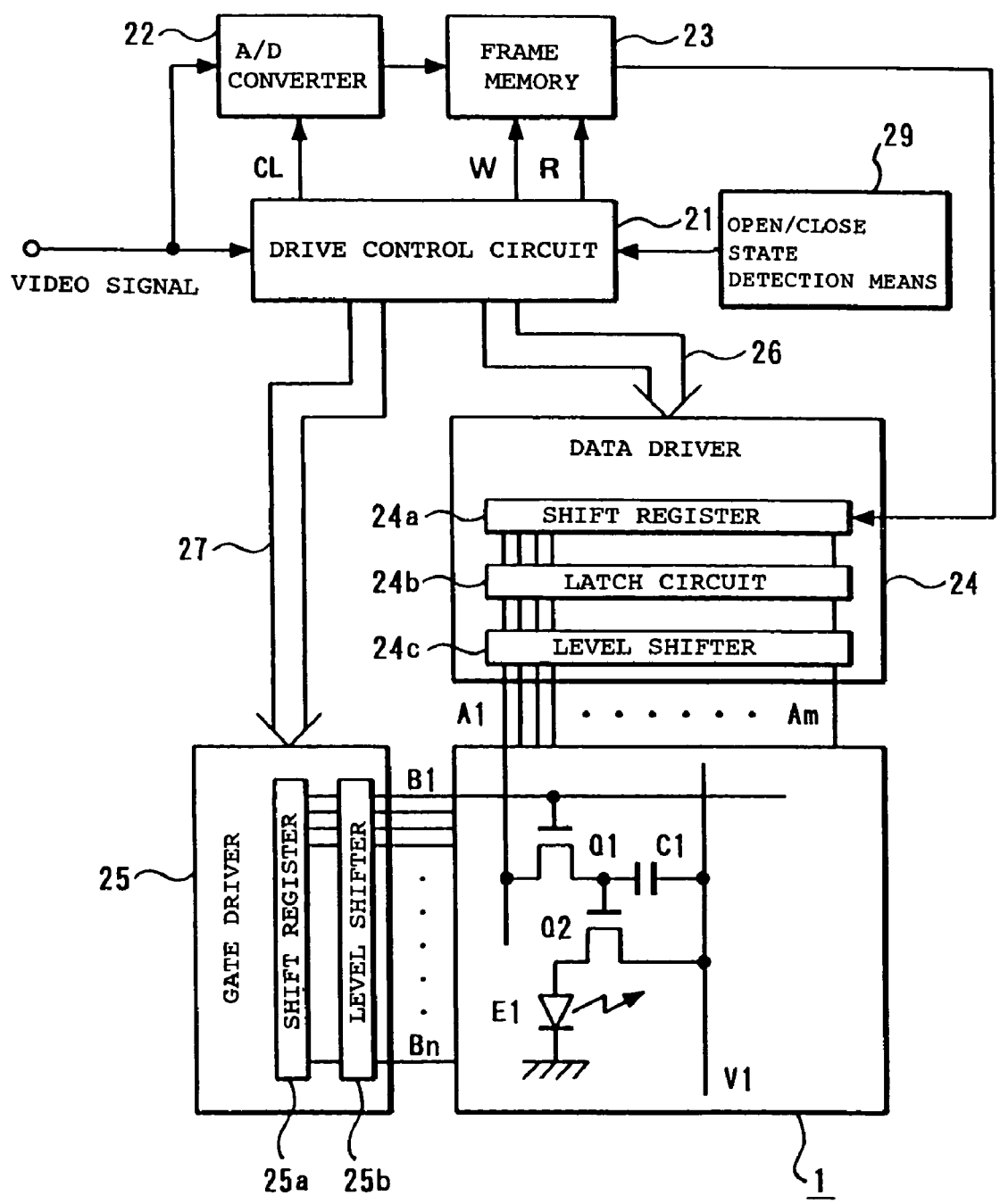
FIG. 2 is a block diagram showing an example of a drive circuit which drives lighting of the self light emitting display device shown in FIG. 1.

FIG. 2 shows by a block diagram an example of a lighting drive circuit which drives lighting of the self light emitting display panel of the above-described structure. A video signal to be displayed is supplied to a drive control circuit 21 and an analogue/digital (A/D) converter 22. The drive control circuit 21 generates a clock signal CL for the A/D converter 22 and a write signal W and a read signal R for a frame memory 23 based on a horizontal synchronization signal and a vertical synchronization signal in the video signal.

The A/D converter 22 samples the inputted video signal based on the clock signal CL supplied from the drive control circuit 21 and converts it to pixel data corresponding to one pixel to supply it to the frame memory 23. The frame memory 23 operates so as to write respective pixel data supplied from the A/D converter 22 in the frame memory 23 one after another by the write signal W supplied from the drive control circuit 21.

When writing of pixel data of one screen (m columns and n rows) part in the display panel is completed by such write operation, the frame memory 23 sequentially supplies serial pixel data which is read out for one row part from the first row to the nth row by the read signal R supplied from the drive control circuit 21 to a shift register 24a in a data driver 24.

At this time, a clock signal, a start signal, a latch signal, and the like are supplied from the drive control circuit 21 to the data driver 24 via a bus line 26. At the same time, a scan clock signal, a scan start signal, and the like are supplied from the drive control circuit 21 via a bus line 27. Based on these signals a gate driver 25 sequentially sends gate ON voltages to respective scan lines as described later.

Provided in the data driver 24 are the shift register 24a which takes serial pixel data of one horizontal period part as parallel data according to a clock signal upon reception of a start signal synchronous with a clock signal supplied via the bus line 26, a latch circuit 24b latching, at one time, pixel data of one horizontal period part supplied from the shift register 24a based on the latch signal outputted at the time of completion of one horizontal period, and a level shifter 24c converting respective pixel data latched by the latch circuit 24b to a predetermined level to output it to the display panel 1.

Provided in the gate driver 25 are a shift register 25a sequentially taking a gate control signal for example corresponding to one frame in accordance with a scan clock signal upon reception of a scan start signal synchronous with a scan clock signal supplied via the bus line 27 during an address period and a level shifter 25b converting the gate control signal taken in the shift register to a predetermined level to output it to the display panel 1.

In the display panel 1, a large number of data electrode lines A1 to Am each of which is connected to the level shifter 24a in the data driver 24 are arranged in a column direction, and a large number of scan electrode lines B1 to Bn each of which is connected to the level shifter 25b in the gate driver 25 are arranged in a row direction.

As one pixel structure is representatively shown in the display panel 1 shown in FIG. 2, the gate of a control TFT (Q1) is connected to the scan electrode line B1 which is from the gate driver 25, and the source of this control TFT (Q1) is connected to the data electrode line A1 which is from the data driver 24. Further, the drain of the control TFT is connected to the gate of a drive TFT (Q2) and is connected to one end of a capacitor C1.

The drain of the drive TFT (Q2) is connected to a power supply line V1, and the other end of the capacitor C1 is also connected to the power supply line V1. Further, the source of the drive TFT is connected to the anode of an organic EL element E1, and the cathode of the organic EL element E1 is constituted by the above-mentioned mat electrode and is connected to the second electrode 7 that is to be a reference potential. This structure is constructed respectively for each pixel portion similarly.

In this structure, an ON voltage is supplied to the gate of the control TFT (Q1), and the control TFT allows current corresponding to the voltage of the pixel data supplied to the source to flow from the source to the drain. The capacitor C1 is charged by the current based on the voltage of the source during the period in which the gate of the drive TFT is the ON voltage. The charge voltage is supplied to the gate of the drive TFT (Q2), and the drive TFT allows current based on the gate voltage and the voltage from the power supply line V1 to flow in the organic EL element E1, whereby the EL element E1 emits light.

When the gate of the control TFT (Q1) becomes an OFF voltage, the control TFT becomes a so-called cutoff, and the drain of the control TFT becomes an open state. Therefore, in the drive TFT (Q2), the gate voltage is maintained by electrical charges accumulated in the capacitor C1. The drive current to the EL element E1 by the drive TFT is maintained until next scan, whereby light emission of the EL element is maintained.

The light emission drive operation of the EL element by the above-mentioned operation can be observed simultaneously in the first light emitting area L1 and the second light emitting area L2 formed in both front and rear faces of the display panel 1 shown in FIG. 1. In this case, in accordance with the direction in which the display panel 1 is turned from the front to the rear, display information by light emission of pixels displayed in the first light emitting area L1 is observed as a horizontally symmetrical pattern or a vertically symmetrical pattern in the second light emitting area L2.

In the circuit structure shown in FIG. 2, in a structure in which the display panel 1 is openably attached to information equipment as described later, the drive control circuit 21 receives a control signal from an open/close state detection means 29 discriminating the open/close state of this display panel. With this structure, the drive control circuit 21 implements processing in which a mirror inversion for an image signal displayed for example in the second light emitting area L2 is performed in accordance with the control signal from the open/close state detection means 29.

Two inversion circumstances are considered in the mirror inversion processing of this case. A mirror inversion for pixel data is performed horizontally in order to allow a horizontally symmetrical inversion pattern displayed in the second light emitting area L2 to be seen as a normal image in the first inversion circumstance, and a mirror inversion for pixel data is performed vertically in order to allow a vertically symmetrical inversion pattern displayed in the second light emitting area L2 to be seen as a normal image in the second inversion circumstance.

The mirror inversion processing can be implemented when respective pixel data corresponding to one frame is written in the frame memory 23 shown in FIG. 2 and also when respective pixel data corresponding to one frame is read out of the frame memory 23. Here, in the case where pixel data is read out of the frame memory 23, a processing example of the case where a horizontally symmetrical mirror inversion is performed and a processing example of the case where a vertically symmetrical mirror inversion is performed will be described with reference to FIG. 3.

First, FIG. 3A schematically shows the processing example of the case where the horizontally symmetrical mirror inversion is performed, and respective reference characters enclosed by ruled line frames, that is, d11, d21, d31, . . . show respective pixel data stored in the frame memory 23 shown in FIG. 2. That is, in accordance with arrangement of respective light emitting elements arranged in the display panel 1, in the frame memory 23, pixel data of m columns parts are written for each row, which are written for n rows parts, so that pixel data of one frame is stored. Arrows shown in FIG. 3A show reading directions of the frame memory 23, and first, respective pixel data stored in the frame memory 23 is read out in the arrow direction shown by reference character R1. Then, pixel data is read out in the order of R2, R3, . . . one after another.

Accordingly, in the processing example of the case where the horizontally symmetrical mirror inversion is performed, pixel data is read out in the order of dm1, . . . d41, d31, d21, d11 in a first scan of an addressing time, and pixel data is read out in the order of dm2, . . . d42, d32, d22, d12 in a second scan. Similar reading processing is performed for all pixel data stored in the frame memory 23 corresponding to one frame shown in FIG. 3A. As a result, the image displayed on the second light emitting area L2 of the display panel 1 is brought to a state in which the horizontally symmetrical mirror inversion is performed with respect to original display data. Thus, a normal display screen in which a mirror inversion is performed in the horizontal direction is displayed on the second light emitting area L2.

Next, FIG. 3B schematically shows the processing example of the case where the vertically symmetrical mirror inversion is performed, and respective reference characters enclosed by ruled line frames, that is, d11, d21, d31, . . . show respective pixel data stored in the frame memory 23 shown in FIG. 2 similarly to the above-described example. Arrows shown in FIG. 3B show reading directions of the frame memory 23, and first, respective pixel data stored in the frame memory 23 is read out in the arrow direction shown by reference character R1. Then, pixel data is read out in the order of R2, R3, . . . similarly.

Accordingly, in the processing example of the case where the vertically symmetrical mirror inversion is performed, pixel data is read out in the order of d1$n$, d2$n$, d3$n$, d4$n$, . . . dm$n$ in the first scan of the addressing time, and similar reading processing is performed for all pixel data stored in the frame memory 23 corresponding to one frame shown in FIG. 3B. As a result, the image displayed on the second light emitting area L2 of the display panel 1 is displayed in a state in which the vertically symmetrical mirror inversion is performed with respect to original display data. Thus, a normal display screen in which a mirror in version is performed in the vertical direction is displayed on the second light emitting area L2.

Figures 4A, 4B:
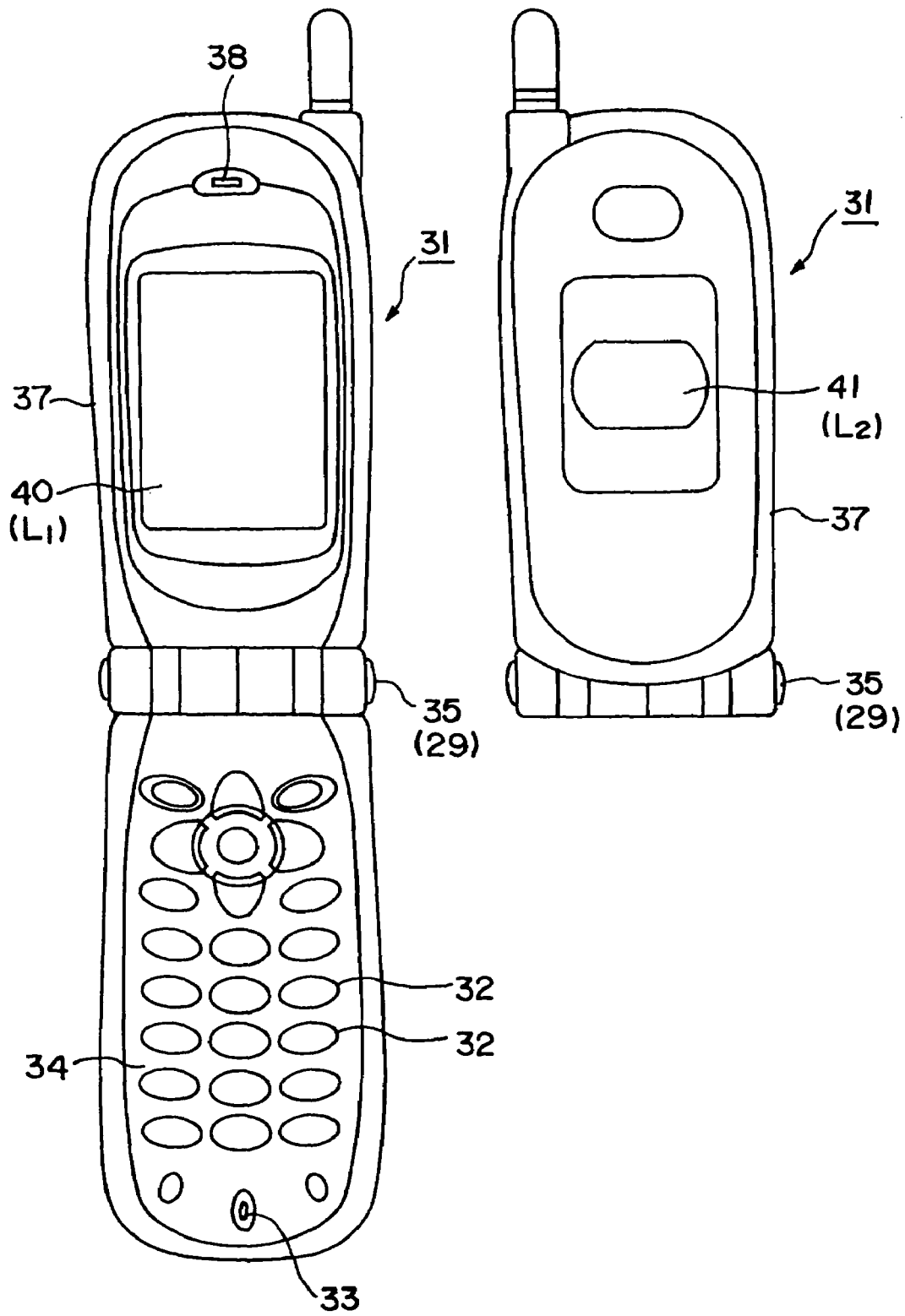
FIG. 4 is views showing a first embodiment of information equipment in which a self light emitting display device according to the present invention is employed.

FIG. 4 shows a first embodiment of information equipment in which the double-sided self-emitting type display panel of the structure shown in FIG. 1 is employed and in which the lighting drive circuit shown in FIG. 2 is adopted. The example shown in this FIG. 4 shows a folding type cellular telephone, wherein FIG. 4A shows a state in which this telephone 31 is opened, and FIG. 4B shows a state in which it is folded.

As shown in FIG. 4, the cellular telephone 31 is composed of an operating portion 34 in which a plurality of keys/buttons 32 are arranged and in which a mouthpiece 33 is formed on a lower end portion and a display portion 37 which is openably coupled with the operating portion 34 via a hinge portion 35 and on which an earpiece 38 is formed on an upper end portion side thereof. In the display portion 37, the double-sided self emitting type display panel 1 described with reference to FIG. 1 is accommodated.

The first light emitting area L1 of the display panel 1 described with reference to FIG. 1 is accommodated in the display portion 37 so as to face a main display portion 40 exposed in a state in which the folding type cellular telephone 31 is opened. A sub display portion 41 with a small area compared to the main display portion 40 is formed on the rear surface of the main display portion 40 as shown in FIG. 4B, and the second light emitting area L2 of the display panel 1 is arranged so as to face this sub display portion 41.

In the folding type cellular telephone 31 shown in FIG. 4, in the state in which the cellular telephone 31 is opened as shown in FIG. 4A, display information of the main display portion 40 is visually recognized in general, and at this time for example a telephone caller number, letters/characters, signs and the like of transmission/reception of electronic mail and the like are displayed on the main display portion 40. In the state in which the cellular telephone 31 is closed as shown in FIG. 4B, display information of the sub display portion 41 is visually recognized, and at this time information for example such as date, time, whether there is an arrival of telephone call, and the like are displayed on the sub display portion 41 as a matter of course.

That is, in the case where the double-sided self emitting type display panel of the structure shown in FIG. 1 is adopted in the cellular telephone 31 of the structure shown in FIG. 4, a user distinguishes which of the first light emitting area L1 or the second light emitting area L2 is visually recognized, and in accordance with this it is necessary to display appropriate information on the first light emitting area L1 or the second light emitting area L2. Further, in the cellular telephone 31 of the structure shown in FIG. 4, for displaying for the first light emitting area L1 and for displaying for the second light emitting area L2, it is necessary to perform the horizontally symmetrical mirror inversion for pixel data.

As described above, the open/close state detection means 29 described with reference to FIG. 2 is disposed on the hinge portion 35 as means by which a user discerns which of the first light emitting area L1 or the second light emitting area L2 is visually recognized in the embodiment shown in FIG. 4. That is, for this detection means 29 for example a rotation detection type microswitch is employed to discern the state in which the telephone is opened or the state in which the telephone is closed via the hinge portion 35.

With the above-described structure, in the case where the state in which the telephone is opened is detected in the open/close state detection means 29, as described above, an image signal to be displayed in the first light emitting area L1 is supplied to be displayed on the main display portion 40. In the case where the state in which the telephone is closed is detected in the open/close state detection means 29, an image signal to be displayed in the second light emitting area L2 is supplied, and at this time the drive control circuit 21 shown in FIG. 2 implements an operation reading out of the frame memory 23, in which the horizontally symmetrical mirror inversion is performed. Thus, letters/characters, signs and the like of a normal image obtained by the horizontally symmetrical mirror inversion are displayed on the sub display portion 41.

Figure 5A:
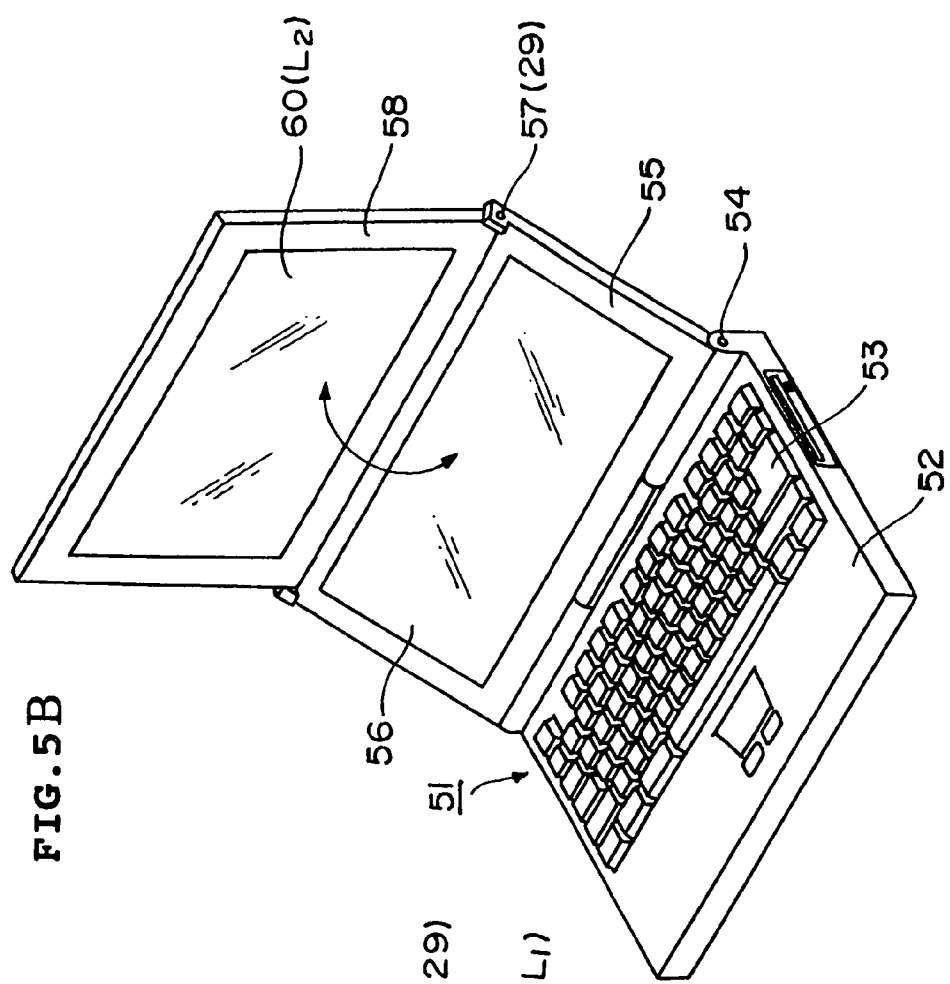
FIG. 5 is similarly views showing a second embodiment of information equipment.
Figure 5B:
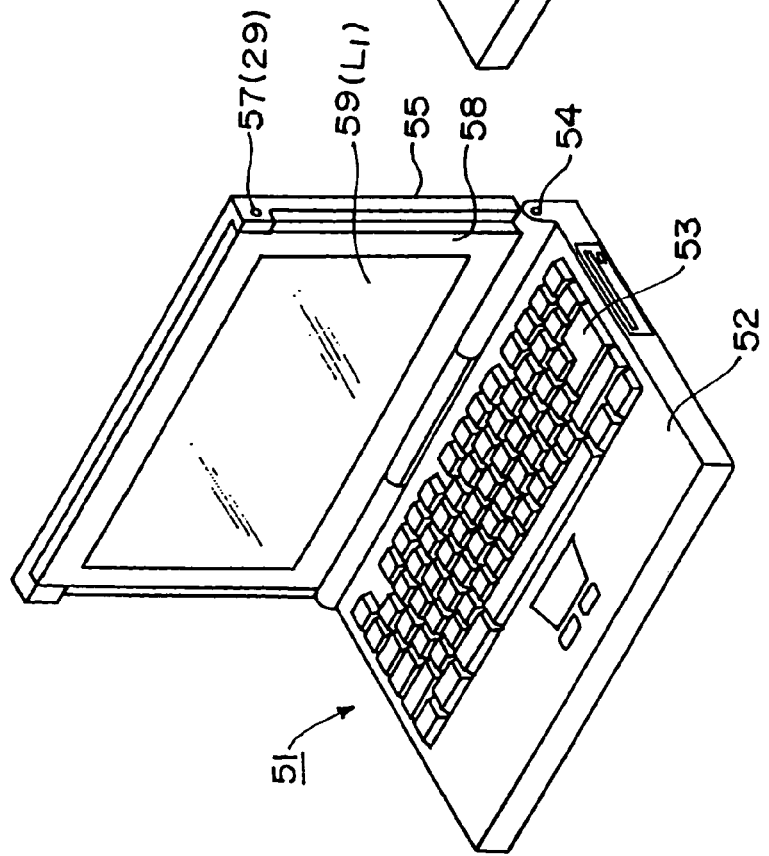

Next, FIG. 5 shows a second embodiment of information equipment in which the double-sided self light emitting type display panel of the structure shown in FIG. 1 is employed and in which the lighting drive circuit shown in FIG. 2 is adopted. The example shown in this FIG. 5 shows a notebook type personal computer, wherein FIG. 5A shows a state in which a display is unfolded in a first state and FIG. 5B shows a state in which the display is further unfolded in a second state.

In the personal computer 51 shown in FIG. 5, a first hinge portion 54 is formed on an end edge of an inner side of a personal computer main body 52 on which a large number of keys 53 are arranged, and a first frame 55 is openably installed via the first hinge portion 54. A first display 56 is installed on the first frame 55 so as to face the personal computer main body 52. A second hinge portion 57 is formed on an end edge of a further top portion side of the first frame 55, and a second frame 58 is further openably installed via this second hinge portion 57.

A double-sided self light emitting type display which functions as a second display is installed on the second frame 58. That is, in the embodiment shown in FIG. 5, the double-sided self light emitting type display panel 1 shown in FIG. 1 is loaded as the second display. In this second display, by unfolding via the first hinge portion 54, a main display portion 59 by the first light emitting area L1 of the display panel 1 is displayed toward a front surface as shown in FIG. 5A. Further,by unfolding via the second hinge portion 57, a sub display portion 60 by the second light emitting area L2 of the display panel 1 is displayed toward a front surface as shown in FIG. 5B.

In the embodiment shown in FIG. 5, the main display portion 59 by the first light emitting area L1 of the display panel 1 loaded as the second display and the sub display portion 60 by the second light emitting area L2 are respectively formed on the same front and rear position, having roughly the same area. The open/close state of the second hinge portion 57 is detected so as to discern a state in which the main display portion 59 is utilized as shown in FIG. 5A or a state in which the sub display portion 60 is utilized in addition to the first display 56 as shown in FIG. 5B.

As means for detecting the open/close state of the second hinge portion 57, a rotation detection type microswitch may be disposed on the second hinge portion 57, or a microswitch detecting whether or not the first frame 55 and the second frame 58 are in a facing (superimposed) state may be disposed. ON/OFF information of these switches function as the open/close state detection means 29 shown in FIG. 2.

Here, in the case of detecting that the second hinge portion 57 is closed, it can be determined that the personal computer 51 is in the utilization state shown in FIG. 5A, and information is displayed on the main display portion 59, that is, on the first light emitting area L1. In the case of detecting that the second hinge portion 57 is opened, it can be determined that the personal computer 51 is in the utilization state shown in FIG. 5B, and information is displayed on the sub display portion 60, that is, on the second light emitting area L2 in addition to the first display 56.

In the case where information is displayed on the second light emitting area L2, the drive control circuit 21 shown in FIG. 2 implements an operation reading out of the frame memory 23, in which the vertically symmetrical mirror inversion is performed. Thus, letters/characters, signs and the like of a normal image obtained by the vertically symmetrical mirror inversion are displayed on the sub display portion 60.

FIG. 6 shows a third embodiment of information equipment in which the double-sided self light emitting type display panel of the structure shown in FIG. 1 is employed and in which the lighting drive circuit shown in FIG. 2 is adopted. The example shown in this FIG. 6 shows an information terminal unit which is generally called PDA (personal digital assistant), wherein FIG. 6A shows a state in which a display is unfolded so that first and second displays can be utilized and FIG. 6B shows a state in which a single display is utilized.

In the PDA 61 shown in FIG. 6, a first display 64 is formed on a PDA main body 63 on which operational keys 62a, 62b are arranged. A hinge portion 65 is formed on a right end edge, as it is faced, of the PDA main body 63, and a frame 66 is installed via this hinge portion 65. A double-sided self emitting type display which functions as a second display is installed in the frame 66. That is, in the embodiment shown in FIG. 6, the double-sided self emitting type display panel 1 shown in FIG. 1 is loaded as the second display.

In this second display, by unfolding via the hinge portion 65, the first display 64 is exposed as shown in FIG. 6A, and a main display portion 67 by the first light emitting area L1 of the display panel 1 is allowed to be positioned in a right side of the first display 64. In the case where the second display is closed via the hinge portion 65, as shown in FIG. 6B, the sub display portion 68 by the second light emitting area L2 of the display panel 1 is displayed toward a front surface.

In the embodiment shown in FIG. 6, the main display portion 67 by the first light emitting area L1 of the display panel 1 loaded as the second display and the sub display portion 68 by the second light emitting area L2 are respectively formed on the same front and rear position and are formed having the roughly same area. The open/close state of the hinge portion 65 is detected so as to discern a state in which main display portion 67 is utilized in addition to the first display 64 as shown in FIG. 6A or a state in which the sub display portion 68 is utilized as shown in FIG. 6B.

As means for detection the open/close state of the hinge portion 65, a rotation detection type microswitch may be disposed on the hinge portion 65, or a microswitch detecting whether or not the PDA main body 63 and the frame 66 are in a state in which they face each other may be disposed. ON/OFF information of these switches function as the open/close state detection means 29 shown in FIG. 2.

Here, in the case of detecting that the hinge portion 65 is in an open state, it can be determined that the PDA 61 is in a utilization state shown in FIG. 6A, and information can be displayed on the main display portion 67, that is, on the first light emitting area L1, in addition to the first display 64. In the case of detecting that the hinge portion 65 is closed, it can be determined that the PDA 61 is in a utilization state shown in FIG. 6B, and at this time information is displayed on the sub display portion 60, that is, on the second light emitting area L2.

In the case where information is displayed on the second light emitting area L2 as described above, the drive control circuit 21 shown in FIG. 2 implements an operation reading out of the frame memory 23, in which the horizontally symmetrical mirror inversion is performed. Thus, letters/characters, signs and the like of a normal image obtained by the horizontally symmetrical mirror inversion are displayed on the sub display portion 68.

Although the embodiments described above show examples in which active drive type display panels are utilized as the double-sided self light emitting type display panel 1, a passive drive type display panel may be utilized. In the case where a passive drive type display panel is utilized, it is necessary to form a first electrode of a striped pattern and a second electrode of a striped pattern which is perpendicular thereto so as to interpose a light emission functional layer therebetween.

In the case where a drive form by anode line drive/cathode line scan is adopted, it is general to utilize a thin film of ITO for the first electrode as an anode line as described above and to use a metal thin film for the second electrode as a cathode line on which current concentrates. In this case, by forming slits or openings on portions of the second electrode made of a metal thin film, image light can be effectively discharged to the second light emitting area L2 side of the display panel 1.

Recently, IZO (indium zinc oxide) and the like have been proposed as a light transmitting electrically conductive material, as a material whose conductivity is much higher than that of the above-mentioned ITO (for example, see Japanese Patent No. 3179287). Therefore, by utilizing a light transmitting material whose conductivity is high as described above for the respective first and second electrodes, it becomes possible to provide a double-sided self light emitting type display panel in which image light can be effectively discharged to both front and rear surfaces of the display panel.

What is claimed is:

1. A self light emitting display device with a structure wherein:
    a first electrode is formed on a transparent substrate,
    light emitting pixels by a light emission functional layer which is composed of at least one or more layers are formed on the first electrode,
    a second electrode is formed on the light emission functional layer, said second electrode being of an opposite polarity to said first electrode, and
    the second electrode is covered with a sealing member, characterized in that
    the first electrode is constructed so as to allow light from the light emitting pixels to pass through the transparent substrate,
    that said first and second electrodes are formed of a light transmitting electrically conductive material, that the second electrode is constructed so as to allow light from the light emitting pixels to pass through the sealing member, and that at least a part of the sealing member is formed of a light transmitting material.

2. The self light emitting display device according to claim 1, wherein a first light emitting area formed by the light emitting pixels on the transparent substrate side and a second light emitting area formed by the light emitting pixels on the sealing member side are formed on a same front and rear position respectively.

3. The self light emitting display device according to claim 2, wherein a light emitting display pattern displayed on the first light emitting area and a light emitting display pattern displayed on the second light emitting area are displayed by a horizontally symmetrical pattern or by a vertically symmetrical pattern.

4. The self light emitting display device according to claim 2, wherein a dot matrix display device in which the light emitting pixels are arranged in a matrix pattern, there is provided a drive control circuit to execute a lighting drive control of the self light emitting display device, and said drive control circuit is constructed in such a way that a light emitting display pattern displayed on the first light emitting area and a light emitting display pattern displayed on the second light emitting area are displayed through a mirror inversion.

5. The self light emitting display device according to claim 1, wherein the display area of the second light emitting area formed by the light emitting pixels on the sealing member side is smaller than that of the first light emitting area formed by the light emitting pixels on the transparent substrate side.

6. The self light emitting display device according to claim 5, wherein a light emitting display pattern displayed on the first light emitting area and a light emitting display pattern displayed on the second light emitting area are displayed by a horizontally symmetrical pattern or by a vertically symmetrical pattern.

7. The self light emitting display device according to claim 5, wherein a dot matrix display device in which the light emitting pixels are arranged in a matrix pattern, there is provided a drive control circuit to execute a lighting drive control of the self light emitting display device, and said drive control circuit is constructed in such a way that a light emitting display pattern displayed on the first light emitting area and a light emitting display pattern displayed on the second light emitting area are displayed through a mirror inversion.

8. The self light emitting display device according to claim 1, wherein polarizing plates whose polarizing surfaces are mutually perpendicular are arranged on the transparent substrate side and the sealing member respectively.

9. Information equipment in which a self light emitting display device is loaded as a display, said self light emitting display device including a first electrode formed on a transparent substrate, light emitting pixels by a light emission functional layer which is composed of at least one or more layers are formed on the first electrode, a second electrode formed on the light emission functional layer, said second electrode being of an opposite polarity to said first electrode, and the second electrode is covered with a sealing member, characterized in that the first electrode is constructed so as to allow light from the light emitting pixels to pass through the transparent substrate, that the second electrode is constructed so as to allow light from the light emitting pixels to pass through the sealing member, said first electrode and said second electrode are formed of a light transmitting electrically conductive material, and that at least a part of the sealing member is formed of a light emitting transmission material, the self light emitting display device is constructed in such a way that a display image by light emitting pixels can be visually recognized from both front and rear surfaces of the display.

10. Information equipment employing a self light emitting display device according to claim 9, wherein a first light emitting area by light emitting pixels formed on one surface side of the display and a second light emitting area by light emitting pixels formed on the other surface side are formed on a same front and rear position in the display.

11. Information equipment employing a self light emitting display device according to claim 9, wherein the display area of the second light emitting area by the light emitting pixels formed in one surface side of the display is smaller than that of the first light emitting area by the light emitting pixels formed in the other surface side of the display.

12. Information equipment employing a self light emitting display device according to claim 10, which is constructed in such a way that a light emitting display pattern displayed on the first light emitting area and a light emitting display pattern displayed on the second light emitting area are displayed by a horizontally symmetrical pattern or by a vertically symmetrical pattern.

13. Information equipment employing a self light emitting display device according to claim 11, which is constructed on the basis of said pixel data in such a way that a light emitting display pattern displayed on the first light emitting area and a light emitting display pattern displayed on the second light emitting area are displayed by a horizontally symmetrical pattern or by a vertically symmetrical pattern.

14. Information equipment employing a self light emitting display device according to claim 10, wherein a dot matrix display device in which the light emitting pixels are arranged in a matrix pattern is employed, and there is provided a drive control circuit to execute the lighting drive control of the self light emitting display device, which drive control circuit is constructed in such a way that a light emitting display pattern displayed on the first light emitting area and a light emitting display pattern displayed on the second light emitting area are displayed through a mirror inversion by control signals.

15. Information equipment employing a self light emitting display device according to claim 11, wherein a dot matrix display device in which the light emitting pixels are arranged in a matrix pattern is employed, and there is provided a drive control circuit to execute the lighting drive control of the self light emitting display device, which drive control circuit is constructed in such a way that a light emitting display pattern displayed on the first light emitting area and a light emitting display pattern displayed on the second light emitting area are displayed through a mirror inversion by control signals.

16. Information equipment employing a self light emitting display device according to any one of claim 14 or 15, wherein a discerning means for discerning which of the first light emitting area or the second light emitting area of the display is to be visually recognized is provided, said drive control circuit being constructed to execute control in response to a control signal from said discerning means so that different image information is switched to be displayed based on information from the discerning means.

17. Information equipment employing a self light emitting display device according to claim 16, wherein the light emitting pixels in the display are constituted by organic EL elements.

18. Information equipment employing a self light emitting display device according to any one of claims 10 to 15, wherein the light emitting pixels in the display are constituted by organic EL elements.

19. Information equipment employing a self light emitting display device according to any one of claims 10 to 13, wherein a discerning means for discerning which of the first light emitting area or the second light emitting area of the display is to be visually recognized is provided so that different image information is switched to be displayed based on information from the discerning means.

20. Information equipment employing a self light emitting display device according to claim 19, wherein the light emitting pixels in the display are constituted by organic EL elements.

* * * * *